US009041447B2

(12) United States Patent
Hwang

(10) Patent No.: US 9,041,447 B2
(45) Date of Patent: May 26, 2015

(54) RECEIVER CIRCUIT

(71) Applicant: SK hynix Inc., Icheon-si Gyeonggi-do (KR)

(72) Inventor: Tae Jin Hwang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 155 days.

(21) Appl. No.: 13/720,424

(22) Filed: Dec. 19, 2012

(65) Prior Publication Data
US 2014/0003482 A1  Jan. 2, 2014

(30) Foreign Application Priority Data

Jun. 28, 2012 (KR) .................. 10-2012-0069992

(51) Int. Cl.
H03K 3/017 (2006.01)
H03K 5/04 (2006.01)
H03K 7/08 (2006.01)
H04L 27/01 (2006.01)
H04L 25/02 (2006.01)
H04L 25/03 (2006.01)

(52) U.S. Cl.
CPC ............ *H04L 27/01* (2013.01); *H04L 25/0292* (2013.01); *H04L 25/03878* (2013.01)

(58) Field of Classification Search
USPC ......... 327/108, 170, 172, 175; 326/83, 86, 85
See application file for complete search history.

(56) References Cited

U.S. PATENT DOCUMENTS

| 6,411,145 | B1* | 6/2002 | Kueng et al. .................. 327/175 |
| 7,170,319 | B1* | 1/2007 | Stiff et al. .................. 326/86 |
| 7,466,193 | B2* | 12/2008 | Kim .................. 330/9 |
| 2011/0128768 | A1 | 6/2011 | Shimizu | |

* cited by examiner

Primary Examiner — Quan Tra
(74) Attorney, Agent, or Firm — William Park & Associates Ltd.

(57) ABSTRACT

A receiver circuit includes a first amplification unit, a second amplification unit, a first equalizing unit, and a second equalizing unit. The first amplification unit is configured to differentially amplify an input signal and a reference signal and generate a first intermediate output signal and a second intermediate output signal. The second amplification unit is configured to differentially amplify the first and second intermediate output signals and generate an output signal. The first equalizing unit is configured to control the level of the second intermediate output signal in response to the output signal. And the second equalizing unit is configured to control the level of the first intermediate output signal in response to the output signal.

12 Claims, 4 Drawing Sheets

RECEIVER CIRCUIT

CROSS-REFERENCES TO RELATED APPLICATION

The present application claims priority under 35 U.S.C. §119(a) to Korean application number 10-2012-0069992, filed on Jun. 28, 2012, in the Korean Intellectual Property Office, which is incorporated herein by reference in its entirety.

BACKGROUND

1. Technical Field

The present invention relates generally to a semiconductor apparatus, and more particularly, to a receiver circuit of a semiconductor apparatus.

2. Related Art

A semiconductor apparatus includes a receiver circuit to receive a signal inputted to an internal circuit from an external source. The receiver circuit converts a signal inputted from the external source into a signal suitable for the internal circuit, and supplies the converted signal to the internal circuit of the semiconductor apparatus.

The receiver includes a buffer circuit for signal conversion. In order to improve the characteristics of the buffer circuit, a two-stage amplification structure to which an equalization or de-emphasis method is applied may be used.

In the conventional equalization or de-emphasis method, a circuit such as a latch or shift register is added to the receiver circuit, or the phase of a clock signal is used. Recently, the semiconductor apparatus has been on a development track where an operation speed is increased, an operation voltage is lowered, and a chip area is reduced. However, since the conventional equalization or de-emphasis method is contrary to the development track of the semiconductor apparatus, there is a limitation in applying the equalization or de-emphasis method to the improved receiver circuit of the semiconductor apparatus.

SUMMARY

A receiving circuit including an equalization or de-emphasis function through a simple circuit structure is described herein.

In an embodiment of the present invention, a receiver circuit includes: a first amplification unit configured to differentially amplify an input signal and a reference signal and generate a first intermediate output signal and a second intermediate output signal, a second amplification unit configured to differentially amplify the first and second intermediate output signals and generate an output signal, a first equalizing unit configured to control the level of the second intermediate output signal in response to the output signal, and a second equalizing unit configured to control the level of the first intermediate output signal in response to the output signal.

In another embodiment of the present invention, a receiver circuit includes: a first amplification unit configured to differentially amplify an input signal and a reference signal and generate first and second intermediate output signals, a second amplification unit configured to generate an output signal in response to the first and second intermediate output signals, and a de-emphasis driver configured to drop the first intermediate output signal by a predetermined level when the output signal is at a low level, and drop the second intermediate output signal by a predetermined level when the output signal is at a high level.

In another embodiment of the present invention, a receiver circuit includes: a first amplification unit configured to differentially amplify an input signal and a reference signal and generate first and second intermediate output signals, a second amplification unit configured to generate an output signal in response to the first and second intermediate output signals, and a de-emphasis driver is configured to drop the first and second intermediate output signals by a predetermined level in response to the output signal.

BRIEF DESCRIPTION OF THE DRAWINGS

Features, aspects, and embodiments are described in conjunction with the attached drawings, in which.

DETAILED DESCRIPTION

Hereinafter, a receiver circuit according to the present invention will be described below with reference to the accompanying drawings through various embodiments.

Figure 1:
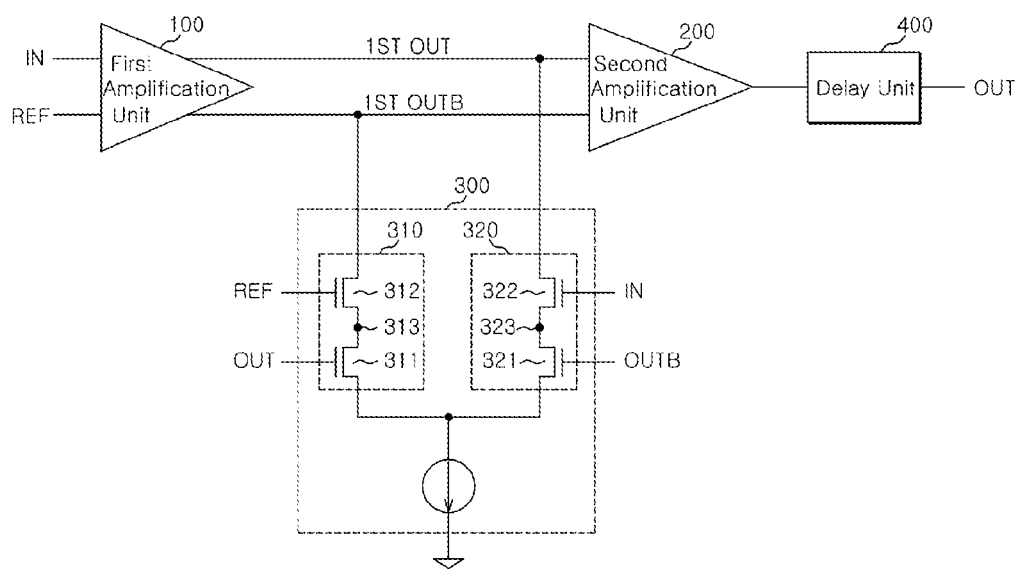
FIG. 1 is a diagram illustrating the configuration of a receiver circuit according to an embodiment of the present invention.

FIG. 1 schematically illustrates the configuration of a receiver circuit 1 according to an embodiment of the present invention. Referring to FIG. 1, the receiver circuit 1 includes a first amplification unit 100, a second amplification unit 200, and a de-emphasis driver 300.

The first amplification unit 100 is configured to receive an input signal IN and a reference signal REF, and generate first and second intermediate output signals 1ST OUT and 1ST OUTB by differentially amplifying the input signal IN and the reference signal REF. The second amplification unit 200 is configured to receive the first and second intermediate output signals 1ST OUT and 1ST OUTB, and generate an output signal OUT in response to the first and second intermediate output signals 1ST OUT and 1ST OUTB. The second amplification unit 200 may generate the output signal OUT by differentially amplifying the first and second intermediate output signals 1ST OUT and 1ST OUTB.

The de-emphasis driver 300 is configured to control the first and second intermediate output signals 1ST OUT and 1ST OUTB in response to the output signal OUT. The de-emphasis driver 300 may drop the first and second intermediate output signals 1ST OUT and 1ST OUTB by a predetermined level in response to the output signal OUT. For example, the de-emphasis driver 300 may drop the second intermediate output signal 1ST OUTB by a predetermined level when the output signal OUT is at a high level, and drop the first intermediate output signal 1ST OUT by a predetermined level when the output signal OUT is at a low level.

In FIG. 1, the de-emphasis driver 300 includes a first equalizing unit 310 and a second equalizing unit 320. The first equalizing unit 310 is configured to drop the second intermediate output signal 1ST OUTB by a predetermined level when the output signal OUT is at a high level. The first equalizing unit 310 may receive the output signal OUT and the reference signal REF and control the level of the second intermediate output signal 1ST OUTB. The second equalizing unit 320 is configured to drop the first intermediate signal 1ST OUT by a predetermined level when an inverted signal OUTB of the output signal is at a high level. The second equalizing unit 320 may receive an inverted signal OUTB of the output signal and the input signal IN and control the level of the first intermediate output signal 1ST OUT.

In FIG. 1, the first equalizing unit 310 includes a first driver 311 and a first switch 312. The first driver 311 is configured to drive a first node 313 to a ground voltage in response to the output signal OUT. The first switch 312 is configured to connect the first node 313 to the second intermediate output signal 1ST OUTB in response to the reference signal REF. The first driver 311 drives the second intermediate output signal 1ST OUTB connected through the first switch 312 (the reference signal REF is at a high level) to the ground voltage level when the output signal OUT is at a high level. The first switch 312 may be provided to prevent the level of the second intermediate output signal 1ST OUTB from being excessively dropped and increase the efficiency of the first driver 311. Therefore, the first equalizing unit 310 may drop the second intermediate output signal 1ST OUTB by a predetermined level when the output signal OUT is at a high level. The first driver 311 is an NMOS transistor of which a gate is configured to receive the output signal OUT, a source is connected to a current source and the ground voltage, and a drain is connected to the first node 313. The first switch 312 is an NMOS transistor of which a gate is configured to receive the reference signal REF, any one of a source and a drain is connected to the first node 313, and the other is connected to the second intermediate output signal 1ST OUTB.

The second equalizing unit 320 includes a second driver 321 and a second switch 322. The second driver 321 is configured to drive a second node 323 to the ground voltage in response to the inverted signal OUTB of the output signal. The second switch 322 is configured to connect the second node 323 to the first intermediate output signal 1ST OUT in response to the reference signal REF. The second driver 321 drives the first intermediate output signal 1ST OUT connected through the second switch 322 (the input signal IN is at a high level) to the ground voltage level when the inverted signal OUTB of the output signal is at a high level. Therefore, the second equalizing unit 320 may drop the first intermediate output signal 1ST OUT by a predetermined level when the output signal OUT is at a low level (when the inverted signal OUTB of the output signal is at a high level). The second driver 321 is an NMOS transistor of which a gate is configured to receive the inverted signal OUTB of the output signal, a source is connected to the current source and the ground voltage, and a drain is connected to the second node 323. The second switch 322 is an NMOS transistor of which a gate is configured to receive the input signal IN, any one of a source and a drain is connected to the is second node 323, and the other is connected to the first intermediate output signal 1ST OUT. The second switch 322 may be provided to prevent the level of the first intermediate output signal 1ST OUT from being excessively dropped and increase the efficiency of the second driver 321.

FIG. 1 illustrates that the first and second switches 312 and 322 and the first and second drivers 311 and 321 include NMOS transistors, but the type of the elements is not limited thereto. The elements may be replaced with PMOS transistors. When the elements are replaced with PMOS transistors, the connections of the output signal inputted to the drivers and the switches such as the inverted signal of the output signal, the input signal, the reference signal and the like may be accordingly changed. Furthermore, the connection relations between the first and second equalizing units and the first and second intermediate output signals may also be modified.

Referring to FIG. 1, the receiver circuit 1 may further include a delay unit 400. The delay unit 400 may control a driving time of the de-emphasis driver 300. The delay unit 400 may control the time at which the output signal OUT and the inverted signal OUTB of the output signal are provided to the de-emphasis driver 300, thereby changing the time at which the de-emphasis driver 300 controls the levels of the first and second intermediate output signals 1ST OUT and 1ST OUTB.

Figure 2:
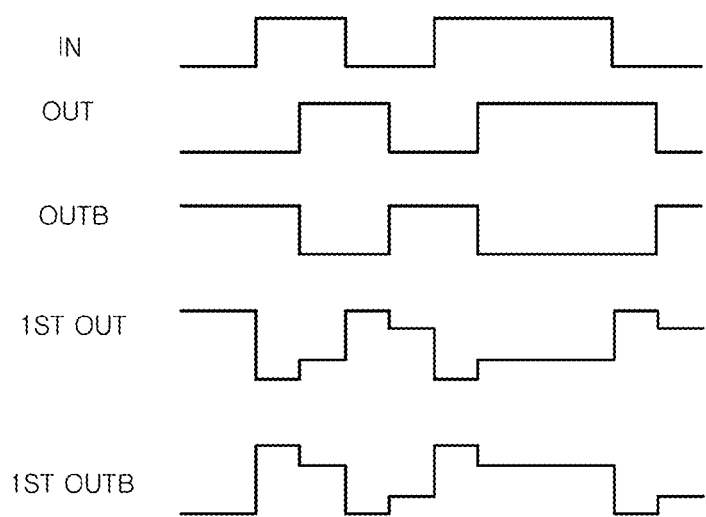
FIG. 2 is a timing diagram illustrating the operation of the receiver circuit according to an embodiment of the present invention.

FIG. 2 is a timing diagram illustrating the operation of the is receiver circuit 1 according to an embodiment of the present invention. In FIG. 2, when the input signal IN is applied at a high level, the first amplification unit 100 outputs the low-level first intermediate output signal 1ST OUT and the high-level second intermediate output signal 1ST OUTB. The second amplification unit 200 receives the low-level first intermediate output signal 1ST OUT and the high-level second intermediate output signal 1ST OUTB, and outputs the high-level output signal OUT.

When the high-level output signal OUT is outputted, the first driver 311 of the first equalizing unit 310 is turned on, and the de-emphasis driver 300 drives the level of the second intermediate output signal 1ST OUTB to the ground voltage, and drops the second intermediate output signal 1ST OUTB by a predetermined level.

When the input signal IN transits to a low level, the first amplification unit 100 outputs the high-level first intermediate output signal 1ST OUT and the low-level second intermediate output signal 1ST OUTB. The second amplification unit 200 receives the high-level first intermediate output signal 1ST OUT and the low-level second intermediate output signal 1ST OUTB and outputs the low-level output signal OUT.

When the low-level output signal OUT is outputted, the second driver 321 of the second equalizing unit 320 is turned on, and the de-emphasis driver 300 drives the level of the first intermediate output signal 1ST OUT to the ground voltage so as to drop the first intermediate output signal 1ST OUT by a predetermined level.

The de-emphasis driver 300 according to an embodiment of the present invention may drop the first and second output signals 1ST OUT and 1ST OUTB by a predetermined level such that the second amplification unit 200 stably generates the output signal OUT. That is, although the slope of the input signal IN provided to the first amplification unit 100 decreases or a jitter occurs, the second amplification unit 200 may output the output signal OUT stably and accurately through the de-emphasis and/or equalizing operation of the de-emphasis driver 300.

Figure 3:
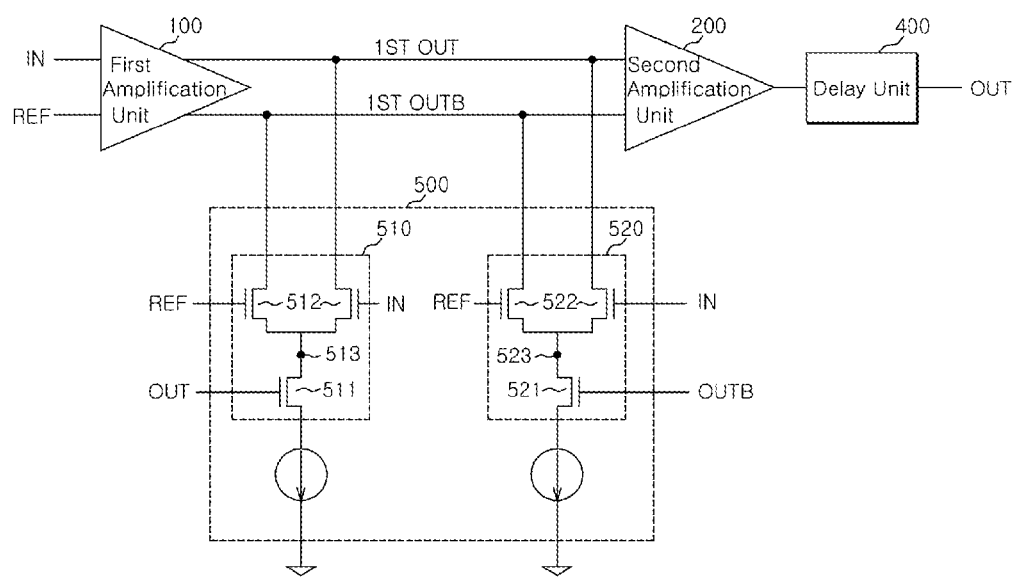
FIG. 3 is a diagram illustrating the configuration of a receiver circuit according to another embodiment of the present invention.

FIG. 3 is a diagram illustrating the configuration of a receiver circuit 2 according to another embodiment of the present invention. Referring to FIG. 3, the receiver circuit 2 includes the first amplification unit 100, the second amplification unit 200, and a de-emphasis driver 500. The receiver circuit 2 has a substantially similar structure as the receiver circuit 1 of FIG. 1, but the configuration of the de-emphasis circuit 500 is changed. Furthermore, the receiver circuit 2 may further include the delay unit 400.

The de-emphasis driver 500 may drop the first and second intermediate output signals 1ST OUT and 1ST OUTB by a predetermined level in response to the output signal OUT. The de-emphasis driver 500 includes first and second driving units 510 and 520. The first driving unit 510 is configured to control the levels of the first and second intermediate output signals 1ST OUT and 1ST OUTB in response to the output signal OUT. The first driving unit 510 drops the first and second intermediate output signals 1ST OUT and 1ST OUTB by a predetermined level, when receiving the high-level output signal OUT.

The second driving unit 520 is configured to control the levels of the first and second intermediate output signals 1ST OUT and 1ST OUTB in response to the inverted signal OUTB of the output signal. The second driving unit 520 drops the first and second intermediate output signals 1ST OUT and 1ST OUTB by a predetermined level, when receiving the inverted signal OUTB of the high-level output signal.

Referring to FIG. 3, the first driving unit 510 includes a third driver 511 and a third switch 512. The third driver 511 is configured to drive a third node 513 to a ground voltage in response to the output signal OUT. The third switch 512 is configured to connect the first and second intermediate output signals 1ST OUT and 1ST OUTB to the third node 513 in response to the input signal IN and the reference signal REF. Therefore, when the third driver 511 is driven in response to the output signal OUT, the first and second intermediate output signals 1ST OUT and 1ST OUTB may be dropped by a predetermined level.

The second driving unit 520 includes a fourth driver 521 and a fourth switch 522. The fourth driver 521 is configured to drive a fourth node 523 to the ground voltage in response to the inverted signal OUTB of the output signal. The fourth switch 522 is configured to connect the first and second intermediate output signals 1ST OUT and 1ST OUTB to the fourth node 523 in response to the input signal IN and the reference signal REF. Therefore, when the fourth driver 521 is driven in response to the inverted signal OUTB of the output signal, the first and second intermediate output signals 1ST OUT and 1ST OUTB may be dropped by a predetermined level.

Figure 4:
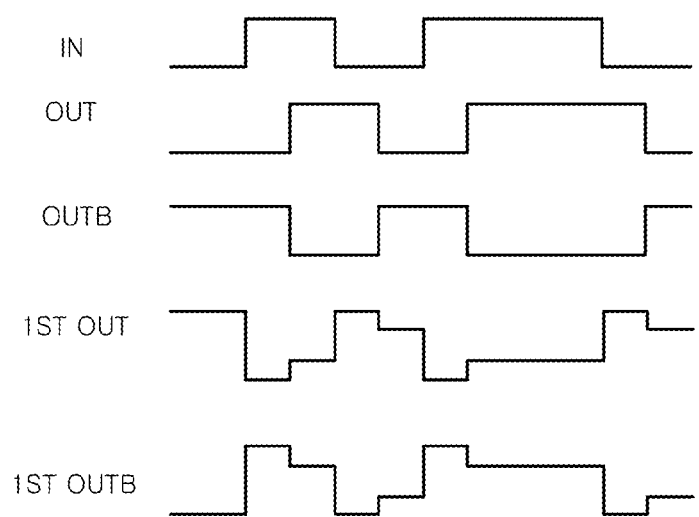
FIG. 4 is a timing diagram illustrating the operation of the receiver circuit of FIG. 3.

FIG. 4 is a timing diagram illustrating the operation of the receiver circuit 2 of FIG. 3. When the input signal IN is applied at a high level, the first amplification unit 100 outputs the low-level first intermediate output signal 1ST OUT and the high-level second intermediate output signal 1ST OUTB. The second amplification unit 200 receives the low-level first intermediate output signal 1ST OUT and the high-level second intermediate output signal 1ST OUTB, and outputs the high-level output signal OUT. When the high-level output signal OUT is generated, the third driver 511 of the first driving unit 510 is turned on, and the de-emphasis driver 500 drives the first and second intermediate output signals 1ST OUT and 1ST OUTB to the ground voltage (the input signal IN and the reference signal REF are both at a high level). Therefore, the de-emphasis driver 500 may drop the first and second intermediate output signals 1ST OUT and 1ST OUTB by a predetermined level.

When the input signal IN is applied at a low level, the first amplification unit 100 outputs the high-level first intermediate output signal 1ST OUT and the low-level second intermediate output signal 1ST OUTB. The second amplification unit 200 receives the high-level first intermediate signal 1ST OUT and the low-level second intermediate signal 1ST OUTB, and outputs the low-level output signal OUT. When the low-level output signal OUT is generated, the fourth driver 521 of the second driving unit 520 is turned on, and the de-emphasis driver 500 drives the first and second intermediate output signals 1ST OUT and 1ST OUTB to the ground voltage (the input signal IN and the reference signal REF are both at a high level). Therefore, the de-emphasis driver 500 may drop both of the first and second intermediate output signals 1ST OUT and 1ST OUTB by a predetermined level.

While certain embodiments have been described above, it will be understood to those skilled in the art that the embodiments described are by way of example only. Accordingly, the receiver circuit described herein should not be limited based on the described embodiments.

What is claimed is:

1. A receiver circuit comprising:
   a first amplification unit configured to differentially amplify an input signal and a reference signal and generate a first intermediate output signal and a second intermediate output signal;
   a second amplification unit configured to differentially amplify the first and second intermediate output signals and generate an output signal;
   a first equalizing unit configured to control the level of the second intermediate output signal in response to the output signal; and
   a second equalizing unit configured to control the level of the first intermediate output signal in response to the output signal,
   wherein the first equalizing unit comprises a first driver configured to drive a first node to a ground voltage in response to the output signal, and a first switch configured to connect the first node to the second intermediate output signal in response to the input signal.

2. The receiver circuit according to claim 1, wherein the first equalizing unit drops the second intermediate output signal by a predetermined level, when the output signal is at a high level.

3. The receiver circuit according to claim 1, wherein the second equalizing unit drops the first intermediate output signal by a predetermined level, when an inverted signal of the output signal is at a high level.

4. The receiver circuit according to claim 3, wherein the second equalizing unit comprises:
   a second driver configured to drive a second node to the ground voltage in response to the inverted signal of the output signal; and
   a second switch configured to connect the second node and the first intermediate output signal in response to the reference signal.

5. The receiver circuit according to claim 1, further comprising a delay unit configured to control a time at which the output signal is provided to the first and second equalizing units.

6. A receiver circuit comprising:
   a first amplification unit configured to differentially amplify an input signal and a reference signal and generate first and second intermediate output signals;
   a second amplification unit configured to generate an output signal in response to the first and second intermediate output signals; and
   a de-emphasis driver configured to drop the first intermediate output signal by a predetermined level when the output signal is at a low level, and drop the second intermediate output signal by a predetermined level when the output signal is at a high level,
   wherein the de-emphasis driver comprises a first equalizing unit configured to control the level of the second intermediate output signal in response to the output signal, and a second equalizing unit configured to control the level of the first intermediate output signal in response to an inverted signal of the output signal, and
   wherein the first equalizing unit comprises a first driver configured to drive a first node to a ground voltage in response to the output signal, and a first switch configured to connect the first node to the second intermediate output signal in response to the input signal.

7. The receiver circuit according to claim 6, wherein the second equalizing unit comprises:
   a second driver configured to drive a second node to a ground voltage in response to the inverted signal of the output signal; and
   a second switch configured to connect the second node to the first intermediate output signal in response to the reference signal.

8. The receiver circuit according to claim 6, further comprising a delay unit configured to control a time at which the output signal is provided to the de-emphasis driver.

9. A receiver circuit comprising:
   a first amplification unit configured to differentially amplify an input signal and a reference signal and generate first and second intermediate output signals;
   a second amplification unit configured to generate an output signal in response to the first and second intermediate output signals; and
   a first driving unit configured to control the levels of the first and second intermediate output signals in response to the output signal; and
   a second driving unit configured to control the levels of the first and second intermediate output signals in response to an inverted signal of the output signal,
   wherein the first driving unit comprises a driver configured to drive a node to a ground voltage in response to the output signal, and a switch configured to connect the node to the first and second intermediate output signals in response to the input signal and the reference signal.

10. The receiver circuit according to claim 9, wherein the first driving unit drops the first and second intermediate output signals by a predetermined level when the output signal is at a high level.

11. The receiver circuit according to claim 9, wherein the second driving unit drops the first and second intermediate output signals by a predetermined level when the inverted signal of the output signal is at a high level.

12. The receiver circuit according to claim 9, wherein the second driving unit comprises:
   an other driver configured to drive an other node to the ground voltage in response to the inverted signal of the output signal; and
   an other switch configured to connect the other node to the first and second intermediate output signals in response to the input signal and the reference signal.

* * * * *